United States Patent
Duncan et al.

(10) Patent No.: US 10,063,629 B2
(45) Date of Patent: Aug. 28, 2018

(54) FLOATING SET POINTS TO OPTIMIZE POWER ALLOCATION AND USE IN DATA CENTER

(71) Applicant: DELL PRODUCTS, L.P., Round Rock, TX (US)

(72) Inventors: Tyler B. Duncan, Austin, TX (US); Mark M. Bailey, Austin, TX (US); Michael M. Toulouse, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 487 days.

(21) Appl. No.: 14/748,201

(22) Filed: Jun. 23, 2015

(65) Prior Publication Data

US 2016/0378314 A1    Dec. 29, 2016

(51) Int. Cl.
*G06F 11/00*   (2006.01)
*H04L 29/08*   (2006.01)
*H05K 7/14*    (2006.01)

(52) U.S. Cl.
CPC ............ *H04L 67/10* (2013.01); *H04L 67/125* (2013.01); *H05K 7/1498* (2013.01)

(58) Field of Classification Search
CPC ... H04L 67/10; H04L 67/125; H04L 67/1002; H04L 67/1006; H04L 67/1023; H04L 67/1031; H04L 67/104; H04L 67/1042; H04L 67/1044; H04L 67/42; H05K 7/1498; H05K 7/1485; H05K 7/1492; H05K 7/1494; G06F 15/16; G06F 15/161
See application file for complete search history.

(56) References Cited

U.S. PATENT DOCUMENTS

| | | |
|---|---|---|
| 5,276,789 A | 1/1994 | Besaw et al. |
| 6,285,967 B1 | 9/2001 | Rajan et al. |
| 6,760,908 B2 | 7/2004 | Ren |
| 7,383,454 B2 | 6/2008 | Loffink et al. |
| 7,426,571 B2 | 9/2008 | Chadalavada |
| 7,603,446 B2 | 10/2009 | Brisse |
| 7,852,627 B2 | 12/2010 | Schmitt et al. |
| 7,961,463 B2 | 6/2011 | Belady et al. |
| 8,046,896 B2 | 11/2011 | Schmitt et al. |
| 8,251,785 B2 | 8/2012 | Schmitt et al. |
| 8,264,840 B2 | 9/2012 | Bergthold et al. |
| 8,446,710 B2 | 5/2013 | Schmitt et al. |
| 8,468,513 B2 | 6/2013 | Zorn |
| 8,488,960 B2 | 7/2013 | DeCusatis et al. |
| 8,533,601 B2 | 9/2013 | LaForest |

(Continued)

*Primary Examiner* — Bryce P Bonzo
*Assistant Examiner* — Anthony J Amoroso
(74) *Attorney, Agent, or Firm* — Isidore PLLC

(57) ABSTRACT

An interactive component-level visual monitoring and control (ICVMC) system of a large-scale information handling system (LIHS) displays on a display device graphical user interfaces (GUIs) that include a visual representation of data centers (DCs) each having functional components operationally configured and interconnected in a system that operates based, at least in part, on one or more set points stored in respective registers. in response to receiving a user selection, ICVMC system changes set point/s respectively in registers in at least one DC based upon a test protocol or a locally-optimized operating protocol to obtain one of a test result and a local optimization of the at least one DC.

17 Claims, 14 Drawing Sheets

(56) References Cited

U.S. PATENT DOCUMENTS

| | | |
|---|---|---|
| 8,726,002 B2 | 5/2014 | Perusse, Jr. |
| 8,733,812 B2 | 5/2014 | Slessman |
| 8,793,587 B2 | 6/2014 | Sayers |
| 8,935,701 B2 | 1/2015 | Bakman |
| 9,100,283 B2 | 8/2015 | Kraus et al. |
| 2002/0158898 A1 | 10/2002 | Hsieh et al. |
| 2003/0140128 A1 | 7/2003 | Cox et al. |
| 2006/0082263 A1 | 4/2006 | Rimler et al. |
| 2006/0218510 A1 | 9/2006 | Ward |
| 2009/0089567 A1 | 4/2009 | Boland, IV et al. |
| 2012/0200206 A1 | 8/2012 | Schmitt et al. |
| 2012/0200992 A1 | 8/2012 | Schmitt et al. |
| 2012/0253710 A1 | 10/2012 | Lehmann et al. |
| 2013/0111275 A1 | 5/2013 | Ganesan et al. |
| 2013/0173768 A1 | 7/2013 | Kundu et al. |
| 2013/0238795 A1 | 9/2013 | Gefin et al. |
| 2014/0033201 A1 | 1/2014 | Dawkins et al. |
| 2014/0122931 A1 | 5/2014 | Devale et al. |
| 2014/0136755 A1* | 5/2014 | Hyde ............... G06F 15/7814 711/103 |
| 2014/0181292 A1 | 6/2014 | Venkataswami et al. |
| 2014/0208214 A1* | 7/2014 | Stern .................. H04L 41/22 715/734 |
| 2014/0297569 A1 | 10/2014 | Clark et al. |
| 2014/0310816 A1 | 10/2014 | Vrhel et al. |
| 2015/0020050 A1 | 1/2015 | Dain |
| 2015/0109332 A1* | 4/2015 | Manzoni ........... G06F 3/04842 345/629 |
| 2015/0169353 A1 | 6/2015 | Colla et al. |
| 2015/0181747 A1* | 6/2015 | Bailey ............... H05K 7/20736 361/679.48 |

\* cited by examiner

FLOATING SET POINTS TO OPTIMIZE POWER ALLOCATION AND USE IN DATA CENTER

RELATED APPLICATIONS

The present application is related to the following copending U.S. patent applications: Ser. No. 14/748,189; Ser. No. 14/748,193; and Ser. No. 14/748,199, all filed concurrently herewith, with relevant content of each related application being incorporated herein by reference.

BACKGROUND

1. Technical Field

The present disclosure relates in general to enterprise-level monitoring and diagnostic systems, and more particularly to graphical user interface (GUI) control of large-scale information handling systems (LIHS).

2. Description of the Related Art

As the value and use of information continue to increase, individuals and businesses seek additional ways to process and store information. One option available to users is information handling systems (IHSes). An IHS generally processes, compiles, stores, and/or communicates information or data for business, personal, or other purposes, thereby allowing users to take advantage of the value of the information. Because technology and information handling needs and requirements vary between different users or applications, IHSes may also vary regarding what information is handled, how the information is handled, how much information is processed, stored, or communicated, and how quickly and efficiently the information may be processed, stored, or communicated. The variations in IHSes allow for IHSes to be general or configured for a specific user or specific use such as financial transaction processing, airline reservations, enterprise data storage, or global communications. In addition, IHSes may include a variety of hardware and software components that may be configured to process, store, and communicate information and may include one or more computer systems, data storage systems, and networking systems.

Conventional modular data centers (MDCs) and server systems are designed with hard set points for power and temperature control for a particular line of units. These hard set points are pre-set at the manufacturer and remain constant regardless of changes in operating conditions of the various similarly configured units.

BRIEF SUMMARY

In accordance with the teachings of the present disclosure, a large-scale information handling system (LIHS) includes more than one data center (DC) that each comprise functional components operationally configured and interconnected in a system that operates based at least in part on one or more set points stored in respective registers. An interactive component-level visual monitoring and control (ICVMC) system includes a network interface in communication with the one or more registers of the one or more DCs. A memory contains a configuration data structure containing a respective address of each DC, a default set point for each of the set points in the respective registers of each DC, and a protocol for triggering performance of a variable set point procedure of the functional components by controlling the one or more set points stored in the respective registers. A processor in communication with the network interface and memory. The processor executes a program module to configure the ICVMC system to change the one or more set points of one or more registers in at least one DC based on the protocol.

In accordance with embodiments of the present disclosure, an ICVMC system of an LIHS includes a network interface in communication with the one or more registers of one or more DCs that each comprise functional components operationally configured and interconnected in a system that operates based at least in part on one or more set points stored in respective registers. A memory contains a configuration data structure that includes (a) a respective address of each DC, (b) a default set point for each of the set points in the respective registers of each DC, and (c) a protocol for setting variable set points for the functional components by controlling the one or more set points stored in the respective registers. A processor is in communication with the network interface and memory and executes a program module to configure the ICVMC system to change the one or more set points respectively in one or more registers in at least one DC based upon the protocol to obtain one of a test result and a local optimization of the at least one DC.

According to illustrative embodiments of the present disclosure, a method is provided of variable set point testing and local optimization of a LIHS. In one or more embodiments, the method includes a controller displaying on a display device one or more GUIs that include a visual representation of one or more selected DCs that each comprise functional components operationally configured and interconnected in a system that operates based at least in part on one or more set points stored in respective registers. The method includes an ICVMC system displaying on the display device a control affordance associated with a protocol for setting variable set points. The method includes the ICVMC system receiving a control selection from a user input component that is capable of manipulating and/or interfacing with one or more items on the GUI. In response to receiving the user selection, the method includes the ICVMC system changing one or more set points respectively in one or more registers in at least one DC based upon the one of the test and the power-optimization local protocol.

The above presents a general summary of several aspects of the disclosure in order to provide a basic understanding of at least some aspects of the disclosure. The above summary contains simplifications, generalizations and omissions of detail and is not intended as a comprehensive description of the claimed subject matter but, rather, is intended to provide a brief overview of some of the functionality associated therewith. The summary is not intended to delineate the scope of the claims, and the summary merely presents some concepts of the disclosure in a general form as a prelude to the more detailed description that follows. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements.

Embodiments incorporating teachings of the present disclosure are shown and described with respect to the figures presented herein, in which.

DETAILED DESCRIPTION

Figure 1:
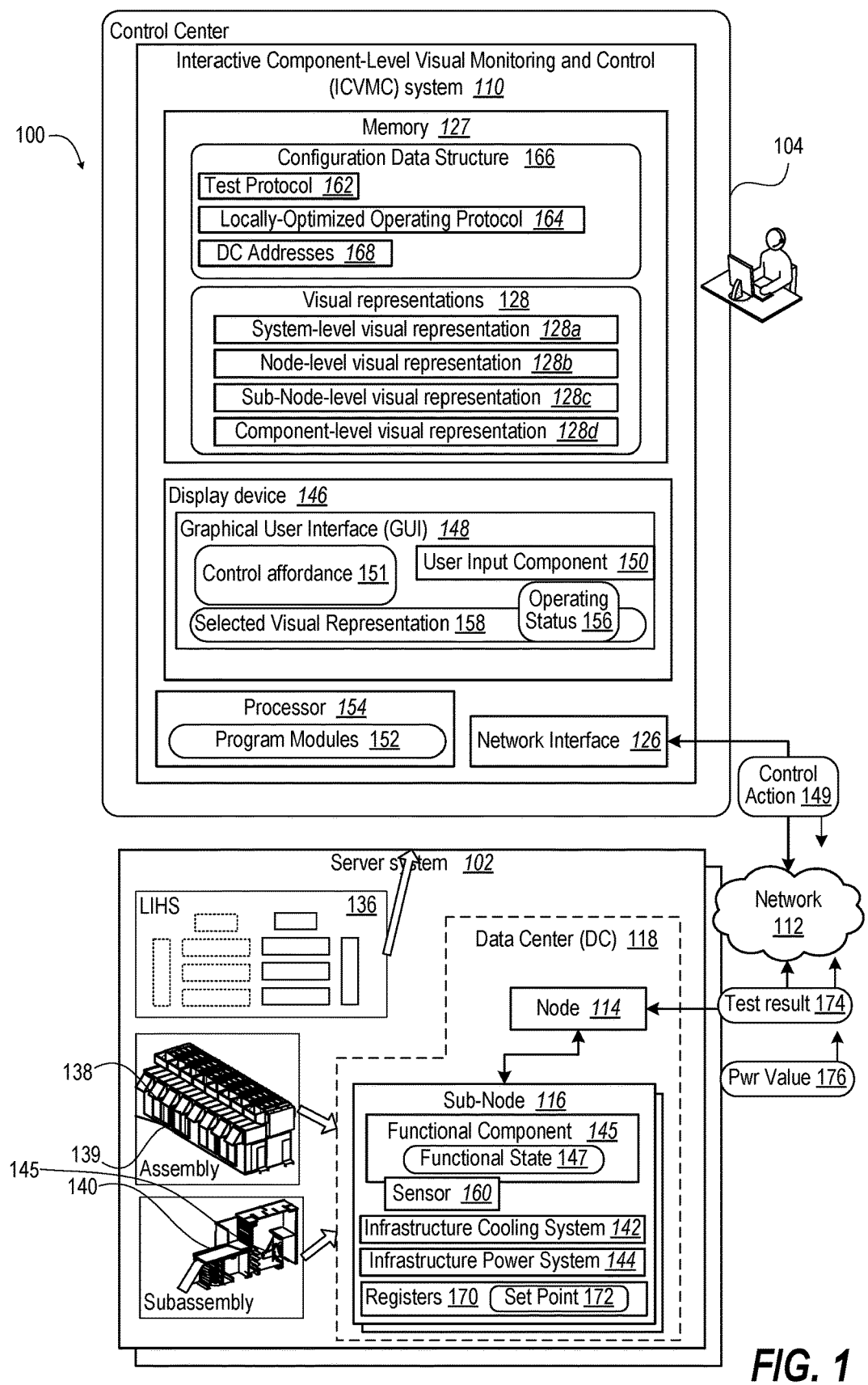
FIG. 1 illustrates a block diagram representation of an example information handling system (IHS) having an Interactive Component-Level Visual Monitoring and Control (ICVMC) System, according to one or more embodiments.

The present innovations provide an Interactive "Component-Level" Visual Monitoring and Control (ICVMC) Module/System for a server system, and with particular application for a server system that is a large-scale IHS (LIHS). In an exemplary embodiment of LIHSes, ICVMC can provide monitoring and diagnostic services for a large-scale modular information handling system (LMIHS) that is a particular type of LIHS based on modular data centers (MDCs) that are networked and centrally managed. In one aspect, ICVMC maps a series of graphical user interfaces (GUIs) linked to different levels and sub-levels of a layout and configuration of hardware devices and firmware components of an information handling system (IHS) such as an MDC or LMIHS. The top level GUI provides a rendering of the general overview of an entire enterprise IHS. From this level, a user is able to drill down to various sub-levels of GUIs representing different parts of device topology. The user can drill down all the way to a device/component level via a series of interactive clicks, touch screen selections, and/or menu selections. Each GUI can present a visual image of physical components at that level or sub-level of the IHS to which the user has drilled down to.

In one or more embodiments, the ICVMC can enable a user to change set points for specific subsystems or components and to monitor specific components, such as at a component-level GUI. Changing the set point can enable a test for an error or failure condition without having to physically break a component. The ICVMC can provide a single selection/button reset to default values for all pre-set variables after testing is completed.

In one or more embodiments, ICVMC can implement a floating set points rather than preset variables to allow each system to look at ambient conditions in a surrounding environment and to auto-tune the system to dynamically determine appropriate set points for that condition in real time. For example, ICVMC can perform automated power control using this ability to determine set points for the overall system in real time based on ambient conditions.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different elements, features, protocols, or concept names are utilized. Thus, each term utilized herein is to be given its broadest interpretation given the context in which that terms is utilized.

FIG. 1 illustrates a block diagram representation of an example information handling system (IHS) 100. In at least one embodiment, because of the relatively large architectural scale of an enterprise, IHS of multiple standalone MDCs and MDCs arranged in a high availability (HA) arrangement as a large-scale information handling system (LIHS) or simply an IHS. Within the general context of IHSes, an information handling system (IHS) 100 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, or any other suitable device and may vary in size, shape, performance, functionality, and price. The IHS may include memory, one or more processing resources such as a central processing unit (CPU) or hardware or software control logic. Additional components or the IHS may include one or more storage devices, one or more communications ports for communicating with external devices, as well as various input and output (I/O) devices, such as a keyboard, a mouse, and a video display. The IHS may also include one or more buses operable to transmit communication between the various hardware components. It is appreciated that the IHS described within the present disclosure is a LIHS, with servers acting as the individual processing units.

In one or more embodiments, the IHS 100 can include a server system 102 that is to be interactively monitored at a component level from a control center 104, which can be co-located with, or remote to, the server system 102. The server system 102 can be one or more rack-mounted servers, a data center (DC) that contains rack-mounted servers, one or more modular data centers (MDCs), or one or more LIHSes. For clarity, an Interactive Component-Level Visual Monitoring and Control (ICVMC) system 110 at the control center 104 communicates over a network 112 with a node 114 and in turn with one or more sub-nodes 116 of a DC 118. The ICVMC system 110 includes a network interface 126 enabling communication with the network 112 over which the node 114 is connected. In one or more embodiments, the network interface 126 can communicate with a local network. In one or more embodiments, the network interface 126 can communicate over a wide area network to geographically dispersed portions of a DC 118.

The ICVMC system 110 includes a memory 127 containing visual representations 128 of the plurality of nodes with a plurality of different levels of visual representations 128, including a system level, node levels, sub-node levels, and component levels. The system level, node levels, sub-node levels, and component levels 128a-128d can be physical representations. For example, a system level visual representation 128a can be an external rendering of three-dimensional computer aided design (CAD) model or photograph of an LIHS 136 that includes more than one MDC 138. A node level visual representation 128b can be an isometric rendering of a CAD model or photograph of an assembly 139, such as one MDC 138. A sub-node level visual representation 128c can be an isometric rendering of a CAD model or photograph of a subassembly 140 of one MDC 138, such as a cooling or power infrastructure subsystem 142, 144. Node level visual representations 128b and/or sub-node level visual representations 128c can include an isometric rendering of a CAD model or photograph of one or more functional components 145. Additional hierarchical representations can be included down to sub-subassemblies, etc. For clarity, some levels of visual representation can include, or entail entirely, a functional representation such as for sensor and electrical power that do not lend themselves readily to an isometric view.

The ICVMC system 110 can include a display device 146 that provides a graphical user interface (GUI) 148 on which each of the different levels of visual representations 128a-128d can be presented. The ICVMC system 110 can include at least one user input component 150 that is capable of manipulating and/or interfacing with one or more items on the GUI 148.

The ICVMC system 110 can execute ICVMC program modules 152 on a processor 154 in communication with the display device 146, the memory 127, and the network interface 126 to configure the ICVMC system 110 to display on the display device 146 the visual representation 128 of one of the plurality of different system, node sub-node levels (e.g., LIHS 136, MDC 138, cooling or power infrastructure system 142, 144) of the IHS 100 based on a current level identified/selected on the GUI 148. The ICVMC system 110 can receive, via the network interface 126, a current functional state 147 of functional components 145 at each component level that is being monitored by one or more sensors 160. The ICVMC system 110 can determine an operating status 156 of the at least one functional component 145 from the current functional state 147 received. The ICVMC system 110 can display on the display device 146 the operating status 156 of the at least one functional component 145 on a selected visual representation 158 at each level of the plurality of different levels when the operating status 156 includes a problem state from among a failed operating state, a malfunctioning state, and/or a check and/or repair (C/R) operating state. For example, a failed operating state can indicate a functional component 145 that is entirely nonfunctional, i.e., has stopped working. A malfunctioning operating state can indicate a functional component 145 that intermittently is nonfunctional. A C/R operating state can be a functional component 145 that is performing its function satisfactorily but is sensed as having an increased likelihood of failure. For example, the service count is high, a sensor reading is out of a normal operating range, such as for power consumed or temperature, etc. The ICVMC system 110 can, in response to receiving a user input selecting a specific component level among the one or more levels that is different from a current level being displayed, modify the GUI 148 to display the visual representation 128a-128d of the specific component level and identify any components having the problem state. In one or more embodiments, the ICVMC system 110 can determine an opportunity for performing a control action 149 over the network 112 to identical functional components 145 on different nodes 114. The ICVMC system 110 displays a control affordance 151 for manipulation/selection by the user input component 150 to trigger the control action 149.

The control action 149 can be associated with executing a test protocol 162 or a locally-optimized operating protocol 164 stored in a configuration data structure 166 in memory 127. The configuration data structure 166 also contains addresses 168 for registers 170 that contain set points 172 and that are accessible via the nodes 114 and sub-nodes 116 of each DC 118. Functional components 145 of the DC 118 are operationally configured and interconnected in a system such as the cooling and power infrastructure systems 142, 144 that operate based at least in part on one or more set points 172 stored in respective registers 170. The processor 154 executes a program module 152 to change one or more set points 172 respectively in one or more registers 170 in at least one DC 118 based upon the test protocol 162 or the locally-optimized operating protocol 164 to obtain a respective one of a test result 174 and a local optimization value 176 of the at least one DC 118.

Figure 2:
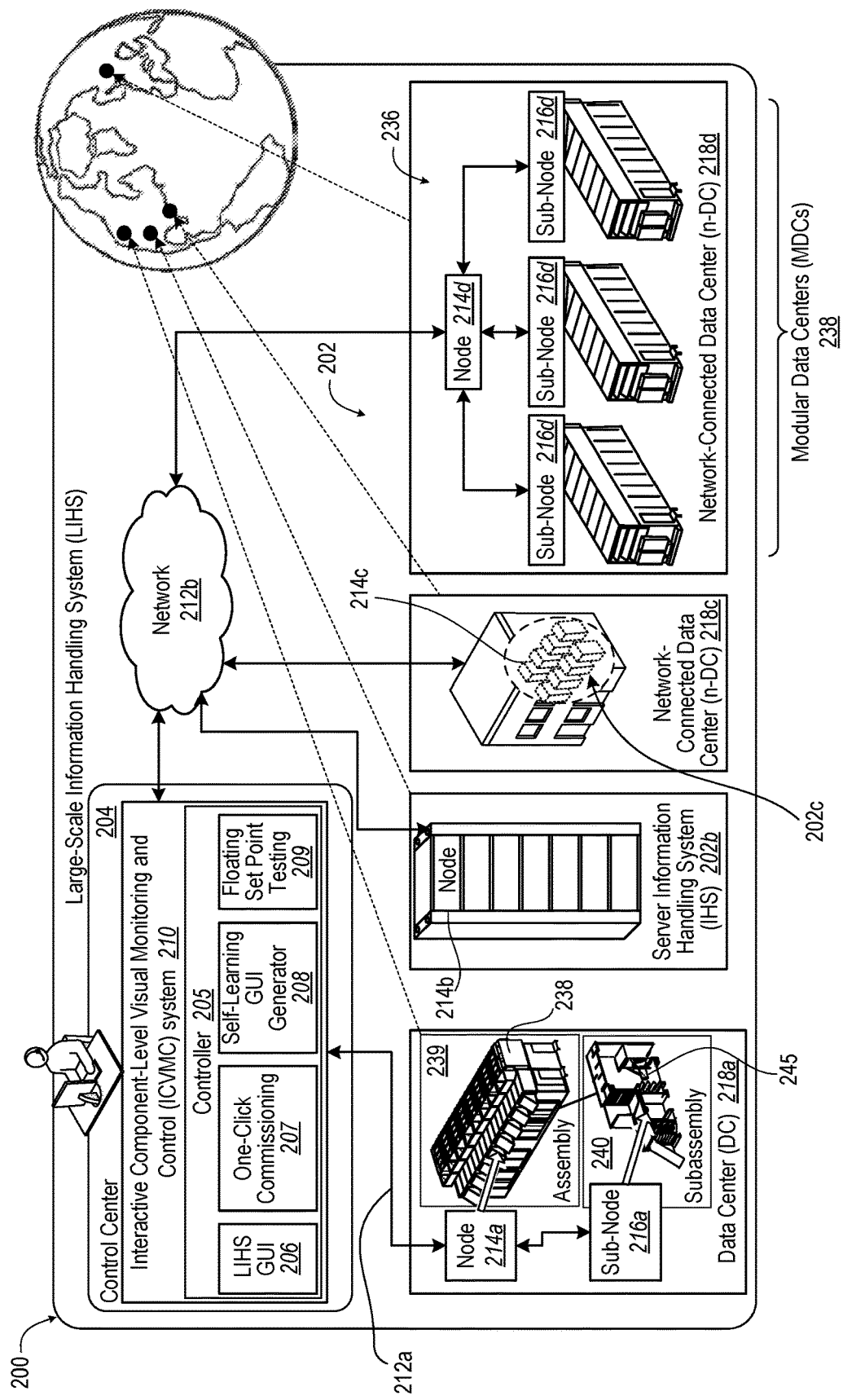
FIG. 2 illustrates an example Large-Scale Information Handling System (LIHS) having server systems that are monitored and controlled by a control center by using an ICVMC system, according to one or more embodiments.

FIG. 2 illustrates an example LIHS 200 having server systems 202 that are monitored and controlled by a control center 204 by using an ICVMC system 210 having a controller 205 that executes program modules. In an exemplary embodiment, the controller 205 executes an LIHS GUI program module 206, a one-click commissioning program module 207, a self-learning GUI generator program module 208, and a floating set point testing program module 209. In one or more embodiments, the ICVMC system 210 manages a node 214a and sub-nodes 216a via a local network 212a of a local DC 218a. For example, the local DC 218a can be an MDC 238 that includes assemblies 239 and subassemblies 240 containing functional components 245. In one or more embodiments, the ICVMC system 210 manages a node 214b of one or rack-mounted server system 202b over a geographically distributed network 212b. In one or more embodiments, the ICVMC system 210 manages a node 214c of a network-connected data center (nDC) 218c having rack-mounted server systems 202c over the geographically distributed network 212b. In one or more embodiments, the ICVMC system 210 manages over the geographically distributed network 212b a node 214d of a network-connected data center (nDC) 218d that includes an LIHS 236 having sub-nodes 216d of MDCs 238.

In an exemplary embodiment, the ICVMC system 210 can perform one or more interactive control functions by monitoring systems. Certain functions are automated and others facilitate control by a human operator. For example, LIHS GUI program module 206 can intuitively utilize CAD models that have problem areas illuminated with semi-transparent overlays. The operator can select areas such as by touching a touch screen to drill down in the GUI to a next deeper level. The GUI can be provisioned with and/or identify all functional components and sensors as well as visually indicate their geographic or relative physical location on CAD models or other physical renderings. In addition to drilling down to component-level visual information, the ICVMC system 210 can facilitate as a unified tool moving to upper levels to quickly visualize an operational layout and operating status of a data center or LIHS. The ICVMC system 210 can push control code to functional components 245 for correcting a malfunction or to perform diagnostic testing.

The one-click commissioning program module 207 of the ICVMC system 210 can provide a single button to push updates or customizations to global data centers. The one-click commissioning program module 207 can provide an automated procedure to test all devices on a module and report the results of each test. The self-learning GUI generator program module 208 of the ICVMC system 210 can change between left and right modules in a setup of an MDC or an LIHS. The self-learning GUI generator program module 208 of the ICVMC system 210 can auto-detect device configuration.

The floating set point testing program module 209 of the ICVMC system 210 can have common control code while utilizing a separate configuration file to set customer/site specific set points for customized operation. The floating set point testing program module 209 can push control code to functional components 245 to perform diagnostic testing and can retrieve diagnostic information, such as programmable logic controller (PLC) logs. The ICVMC system 210 can also perform testing of a communication system across the LIHS 200 by decoupling control code from communication outputs. For example, a single button control can set unique values to all analog registers to prove true one-to-one correspondence. For another example, automatic cycling through all registers can be performed at a user-defined speed to test that all binary registers are received by third-party software. The floating set point testing program module 209 can use persistent variables for all set points, which are modifiable by users who have user level security credentials for commissioning or for administration. The floating set point testing program module 209 can return all set points to factory defaults after commissioning user level is completed. The floating set point testing program module 209 can enable floating set points to optimize power while controlling temperature and humidity for specific portions of the LIHS 200.

Figure 3:
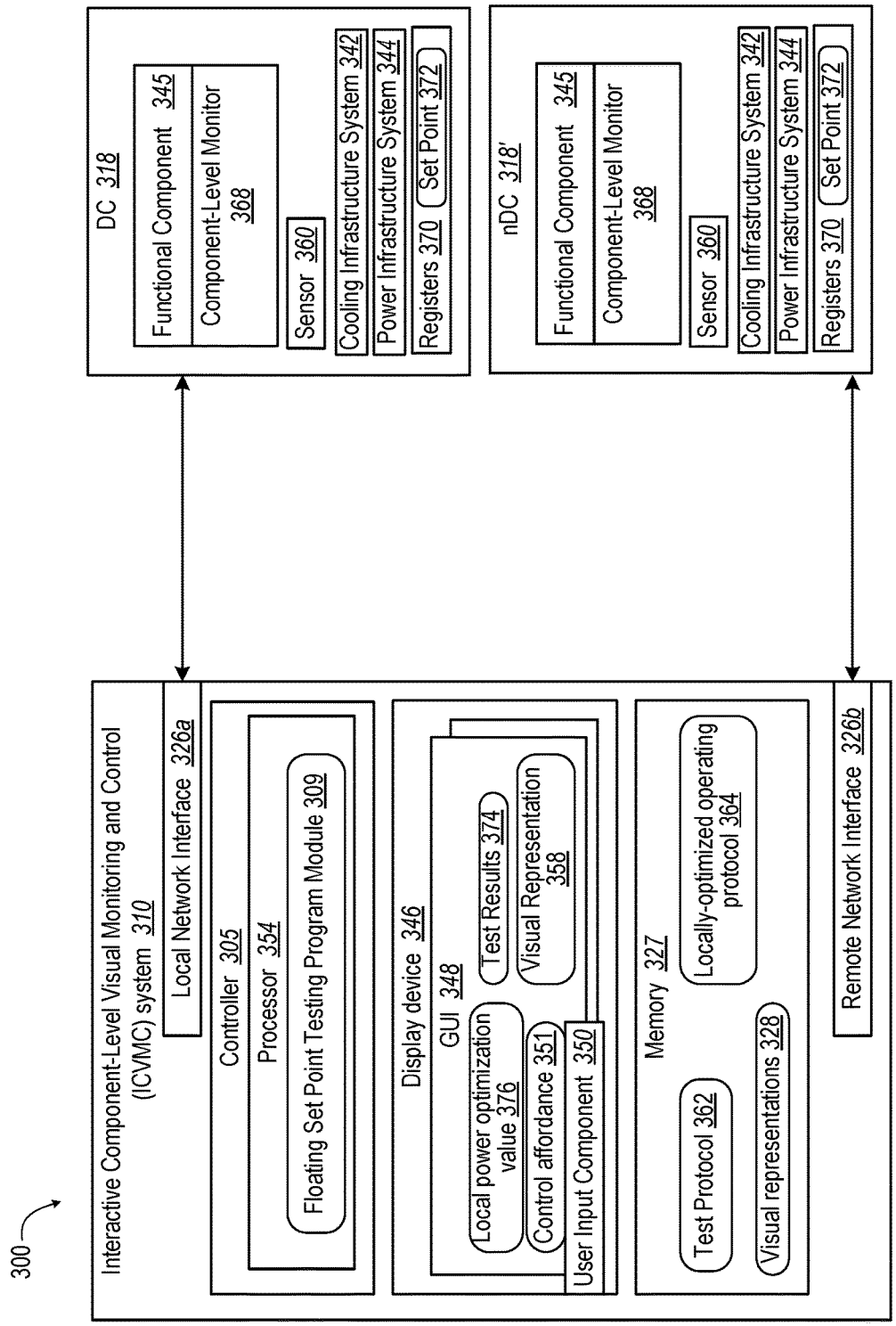
FIG. 3 illustrates an LIHS in which a controller of the ICVMC system executes a variable set point program module to perform a control action to identical functional components of different nodes of the LIHS, according to one or more embodiments.

FIG. 3 illustrates an LIHS 300 in which a controller 305 of an ICVMC system 310 has a processor 354 that executes a floating set point testing program module 309 to change set points of select DCs 318 for either testing purposes or local optimization. Local optimization can be for one or more benefits such as power reduction, service life extension, improved environmental controls, reduction of corrosion contributors, etc. In one or more embodiments, the ICVMC system 310 controls more than one DC 318. For clarity, the ICVMC system 310 communicates over a local network interface 326a to the DC 318 and over a remote network interface 326b to a network-connected data center (nDC) 318'. Each of DC 318 and nDC 318' include component monitors 368 that respectively monitor at least one functional component 345 and that communicate with a respective network interface 326a, 326b.

In one or more embodiments, the controller 305 executes a testing protocol 362 by setting one or more set points 372 of the respective register/s 370 to a test value to cause the respective DC 318 and/or nDC 318' to operate a functional component 345 in an abnormal state to simulate a failure mode. The controller 305 monitors the component monitor 368 of the respective DC 318 and/or nDC 318' to detect a test result 374 of the functional component 345 operating in the abnormal state.

A user input component 350 is capable of manipulating and/or interfacing with one or more items on the GUI 348 that is presented on display device 346. In particular, a user control affordance 351 can be presented on the GUI 348. The controller 305 can detect and respond to user selection of the user control affordance 351. To enhance the GUI 348, the control affordance 351 can be associated with a visual representation 358 of the affected functional component 345, set point 372 and/or infrastructure cooling or power system 342, 344 of the selected DC 318, 318'. The GUI 348 can also present the test result 374.

In one or more embodiments, the controller 305 executes a locally-optimized operating protocol 364 to achieve optimizations according to ambient conditions for the cooling or power infrastructure systems 342, 344 of the respective DC 318 and/or nDC 318'. In particular, the controller 305 can change set points 372 in the registers 370 from default to variable set points to cause DC 318 and/or nDC 318' to locally optimize according to the set point 372. The optimized operating can be based upon ambient conditions sensed by ambient sensors 360 at the respective DC 318 and/or nDC 318'. The resulting local optimization value 376 can be displayed on the GUI 348. Local optimization can be for one or more benefits such as power reduction, service life extension, improved environmental controls, reduction of corrosion contributors, etc.

Figure 4:
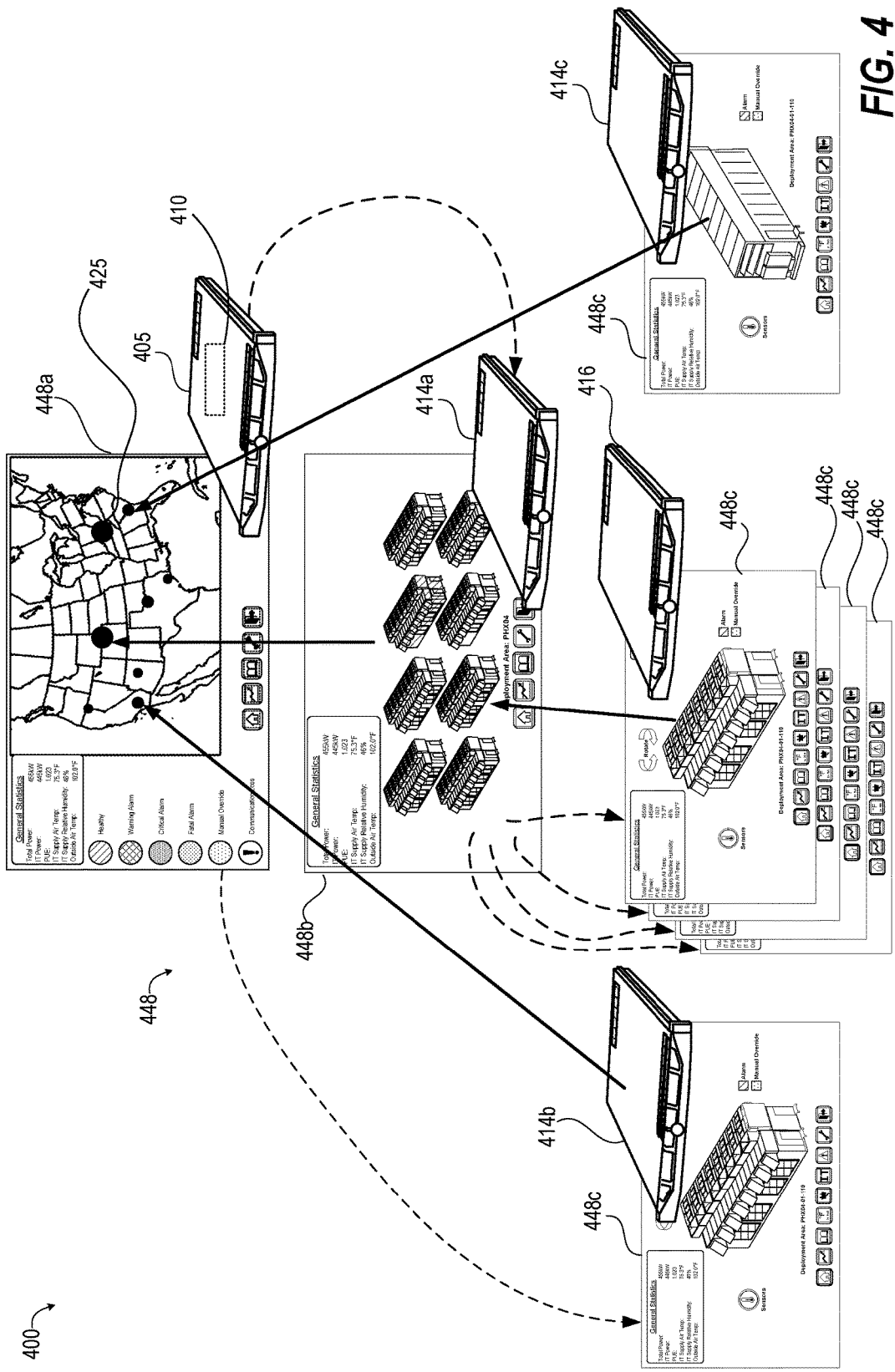
FIG. 4 illustrates a multi-tiered LIHS with an ICVMC system including a controller to monitor and control nodes and a sub-node using a multi-tier GUI, according to one or more embodiments.

FIG. 4 illustrates an LIHS 400 that is multi-tier with an ICVMC system 410, which includes a controller 405 to monitor and control nodes 414a-414c and a sub-node 416 using a multi-tier GUI 448. The GUIs can be multi-tier by presenting the LIHS 400 in different levels of detail and granularity. A fault at a particular geographic location can be presented in an upper level view. A user can drill down through tiers or levels in a hierarchy of GUIs to follow the fault to one or more contributing functional components or subsystem of functional components. In one or more embodiments, an upper level GUI 448a can depict a geographical view 425 with locations and operating status of server systems annotated. A user input to a location can link to a large-scale system level GUI 448b, which can include a data center layout of multiple MDCs. A user input to a particular MDC on the large-scale system level GUI 448b can link to one of more than one system-level GUIs 448c. Other locations on the upper-level GUI 448a can link directly to a system-level GUI 448c for smaller data centers. The levels can also be referred to as nodes and sub-nodes. Additional levels of GUIs can be provided in other implementations, and the presentation herein of a specific subset of GUIs is not intended to limit or be viewed as a limitation on the actual numbers of levels utilized and/or available to be accessed and displayed.

Figure 5:
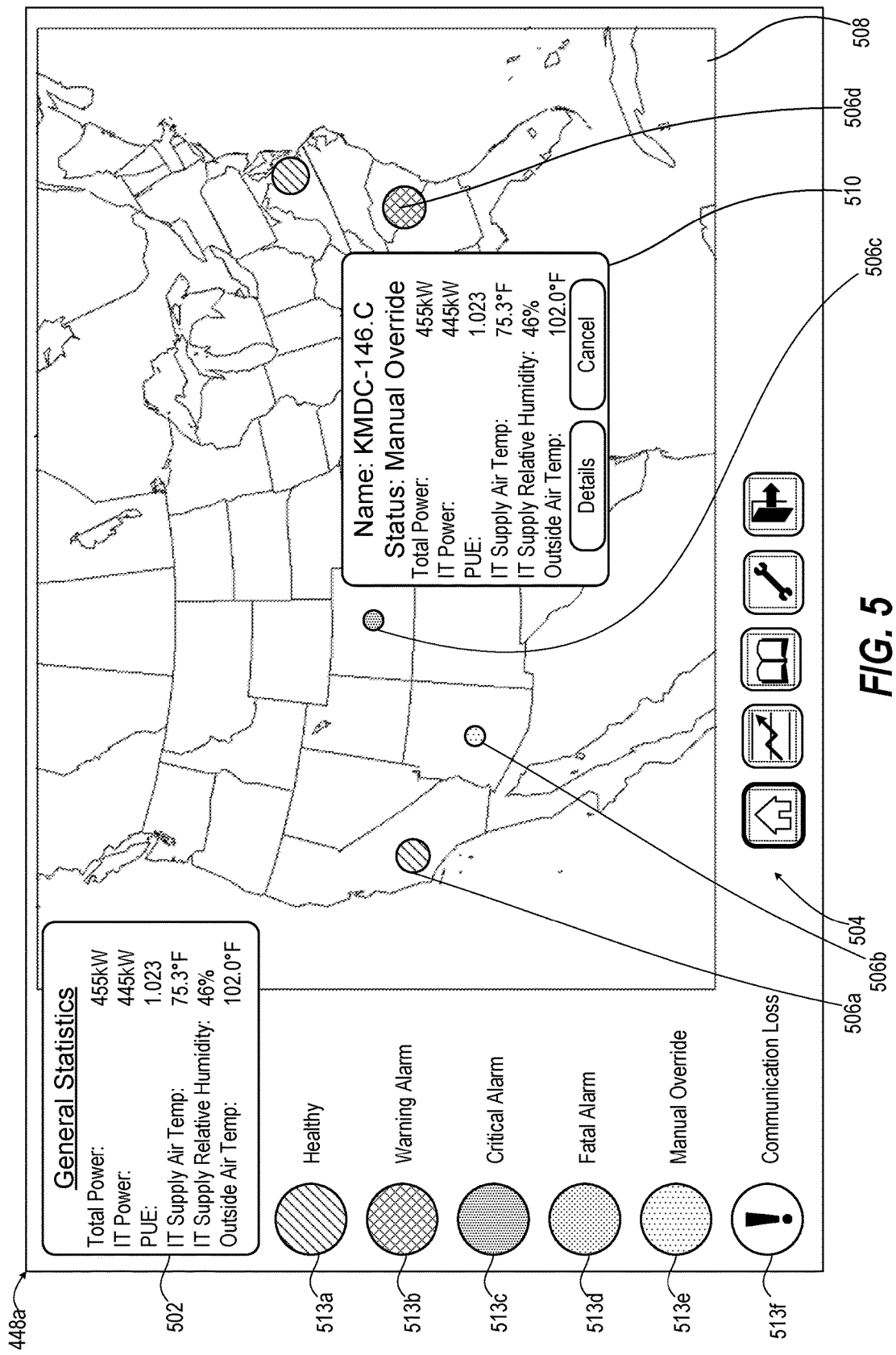
FIG. 5 illustrates an upper-level GUI with location annotations on a geographic map, according to one or more embodiments.
Figure 6:
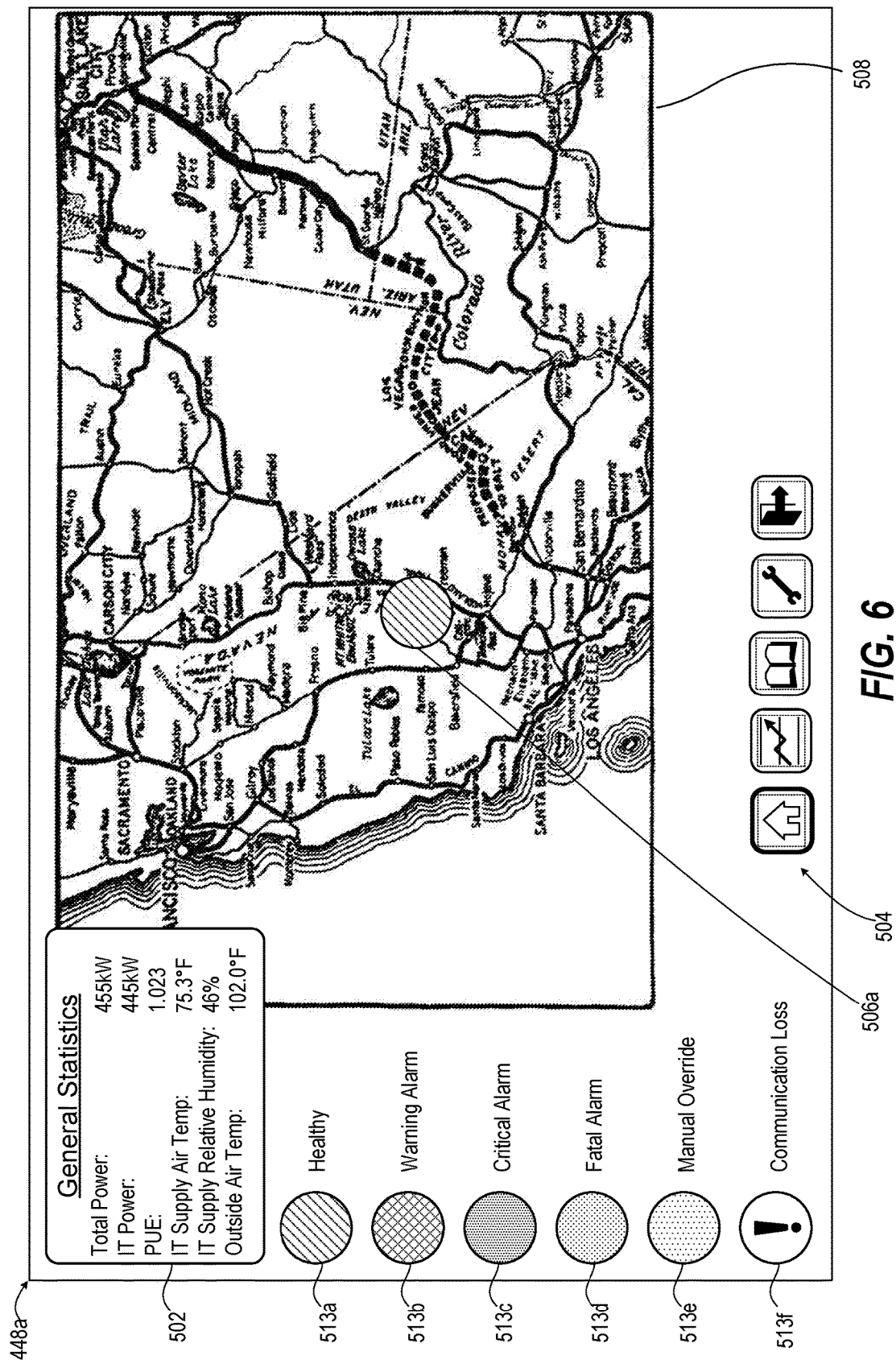
FIG. 6 illustrates the upper-level GUI of FIG. 5 with a change in the scale of the geographic map, according to one or more embodiments.

FIG. 5 illustrates the upper-level GUI 448a with high level statistic legend 502, control keys 504, and location annotations 506a-506d on a geographic map 508. This upper level GUI 448a can provide physical aspects of the city, highways, power infrastructures, with minimal details of each portion of the LIHS 400. The location annotations 506a-506d are colored or patterned according to their respective operating status as specified in color status indications 513a-513f respectively for healthy, warning alarm, critical alarm, fatal alarm, manual override, and communication loss. A location status legend 510 is selected to provide more information about the operating status. FIG. 6 illustrates the upper-level GUI 448a with a change in the scale of the map 508. The map 508 can be geographically accurate, drawn to equally space each location regardless of the actual distance between locations, or drawn with other orientations. In one or more embodiments, the LIHS 400 can be at a single location thus obviating the need for a map 508.

Figure 7:
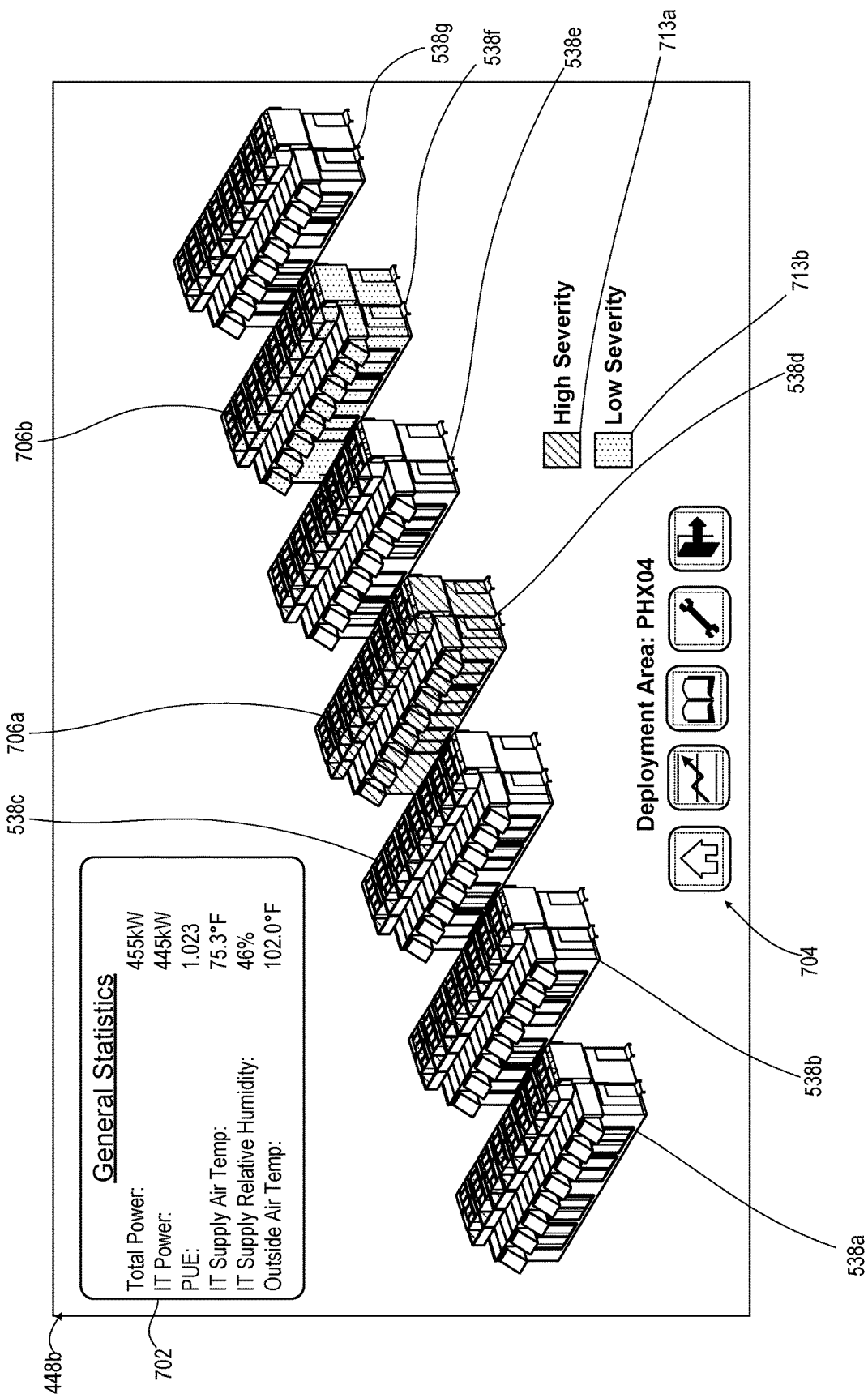
FIG. 7 illustrates a large-scale system level GUI with color or pattern overlays depicting operating or problem status, according to one or more embodiments.
Figure 8:
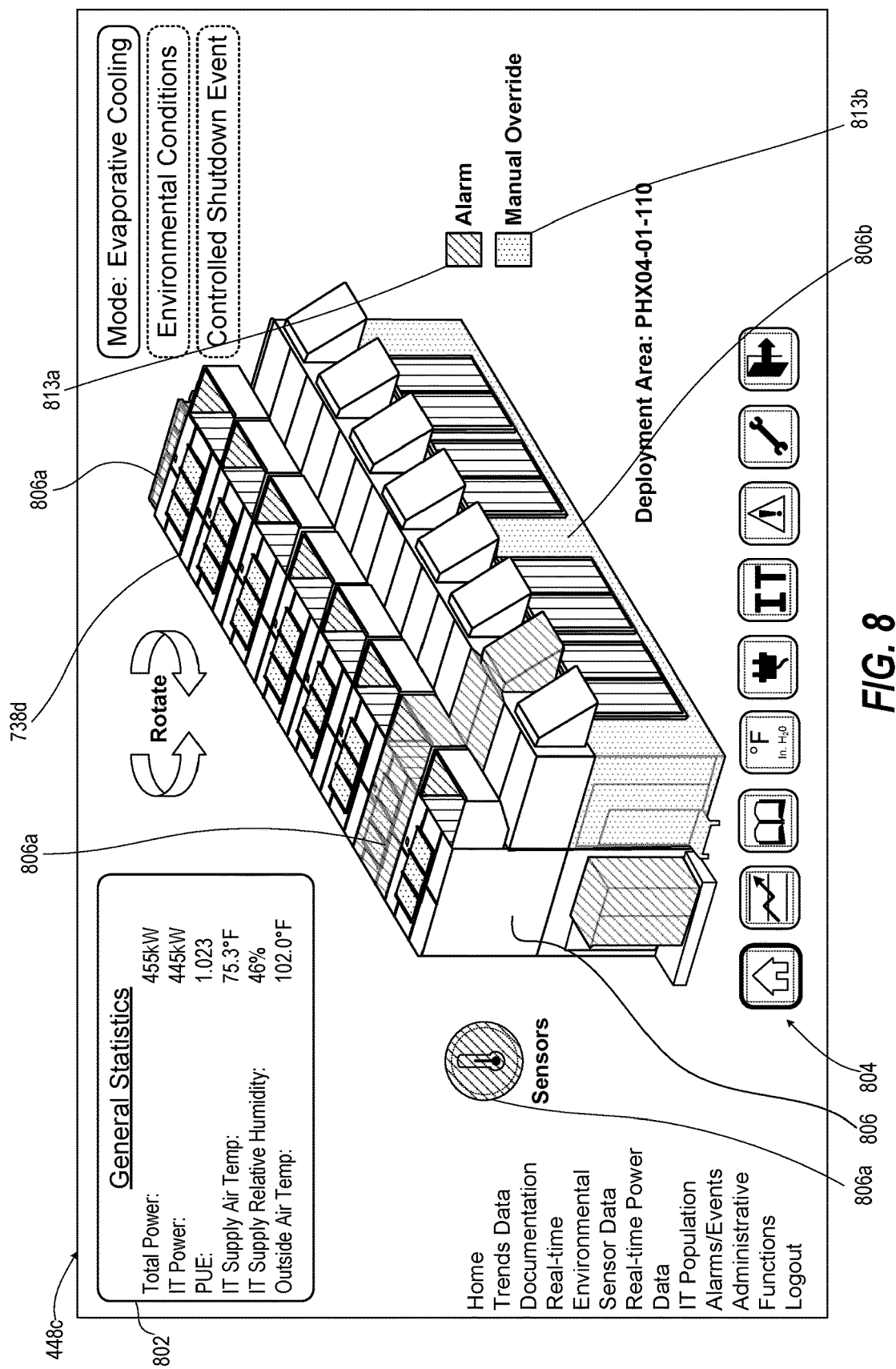
FIG. 8 illustrates a system level GUI with color or pattern overlays depicting operating or problem status, according to one or more embodiments.
Figure 9:
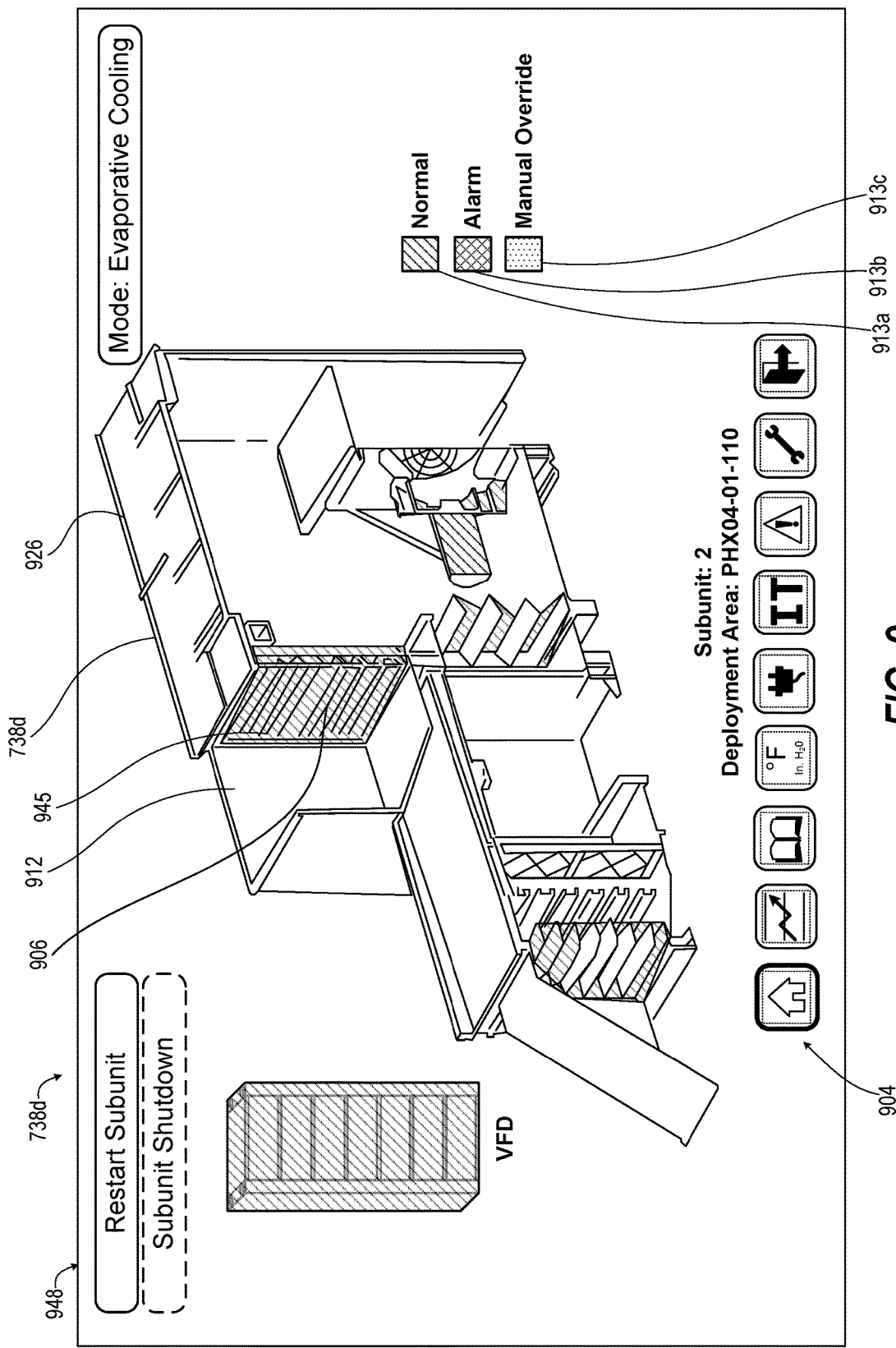
FIG. 9 illustrates a subsystem level GUI with color or pattern overlays for operating or problem status, according to one or more embodiments.
Figure 10:
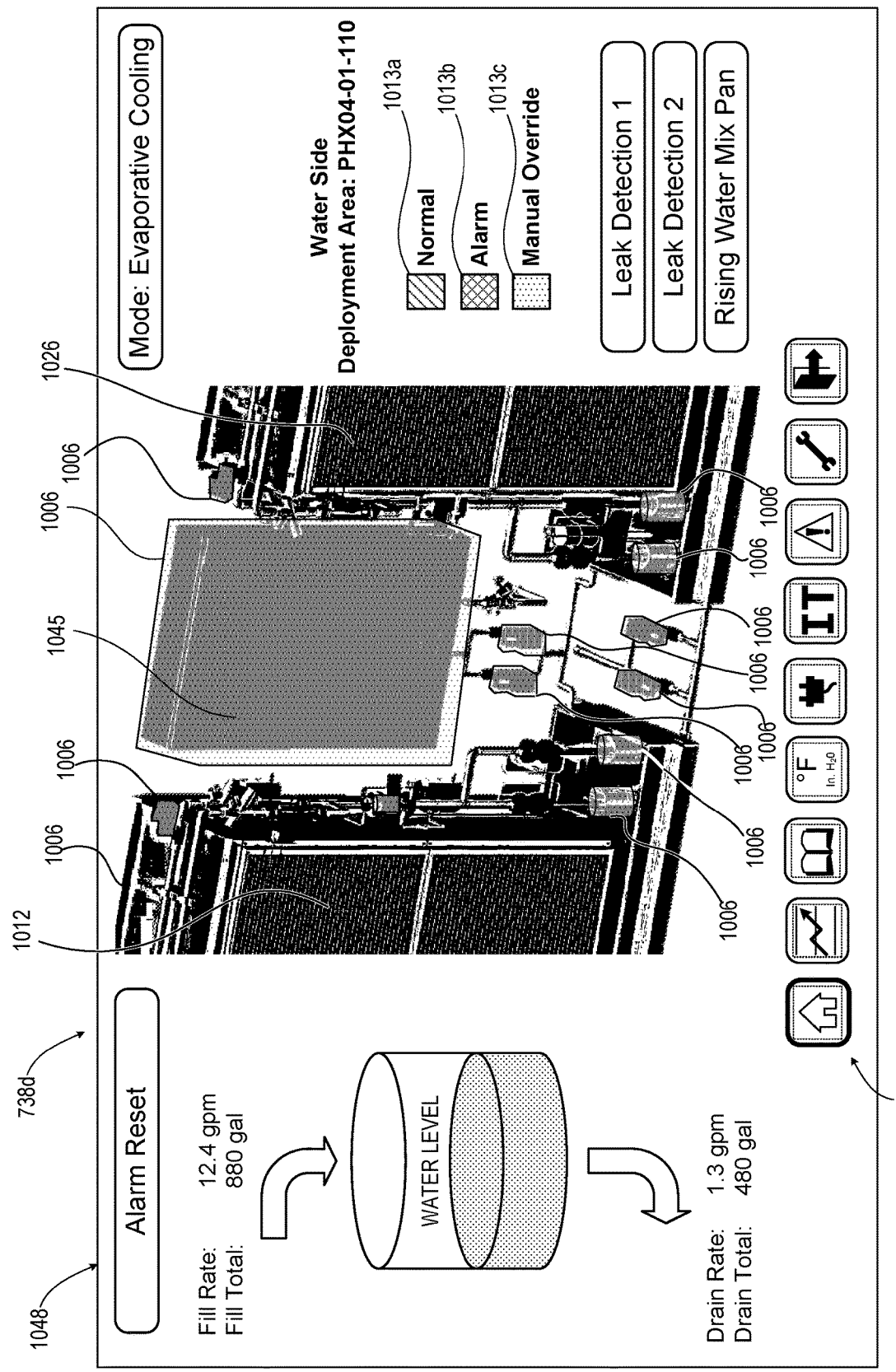
FIG. 10 illustrates an example component level GUI with color or pattern overlays depicting operating or problem status, according to one or more embodiments.
Figure 11:
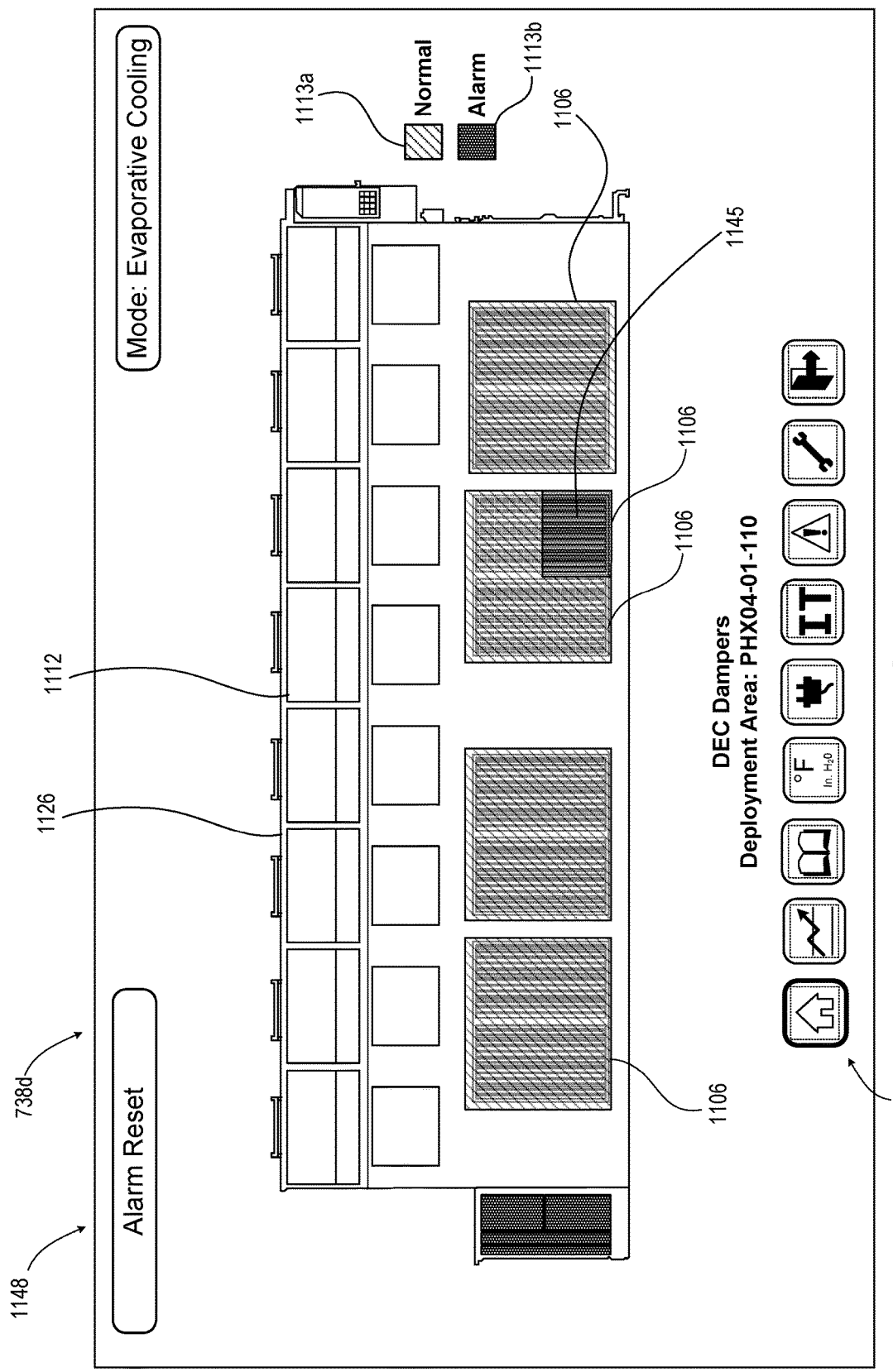
FIG. 11 illustrates an additional example subsystem level GUI with color or pattern overlays depicting operating or problem status, according to one or more embodiments.

FIG. 7 illustrates the large-scale system level GUI 448b with high level statistic legend 702, control keys 704, and MDCs 738a-738g. MDC 738d has a color or pattern overlay 713a for high severity and MDC 738f has a color or pattern overlay 713b for low severity. Within the described embodiments, severity can indicate a level of degradation of performance of a particular portion of the LIHS 400. Alternatively or in conjunction, severity can indicate a level of urgency of performing repairs. Severity can also indicate a level of risk of damage to the LIHS 400. The level of severity can be identified with specific color coding at the particular location of the component that is experiencing or exhibiting a problem state (e.g., failure condition provides a red color overlay of the component location). FIG. 8 illustrates a system level GUI 448c with high level statistic legend 802, control keys 804, and a physical presentation 806 of the MDC 738d with color or pattern overlays for graphical status indications 806a for textual status indication 813a and color or pattern overlay 806b for an operating status of manual override 813b. FIG. 9 illustrates a subsystem level GUI 948 with control keys 904, and a physical presentation 926 of a subassembly 912 of MDC 738d with color or pattern overlays for graphical status indications 906 that are explained to correspond for an operating status for functional components 945 respectively of a normal status indication 913a, an alarm status indication 913b and a manual override status indication 913c. FIG. 10 illustrates an example component level GUI 1048 with control keys 1004, and a physical presentation 1026 of a subassembly 1012 of MDC 738d with color or pattern overlays 1006 respectively for an operating status for functional components 1045 respectively of a normal status indication 1013a, an alarm status indication 1013b and a manual override status indication 1013c. FIG. 11 illustrates a subsystem level GUI 1148 with control keys 1104, and a physical presentation 1126 of a subassembly 1112 of MDC 738d with color or pattern overlays 1106 respectively for an operating status for functional components 1145 respectively of normal 1113a and alarm 1113b.

Figure 12:
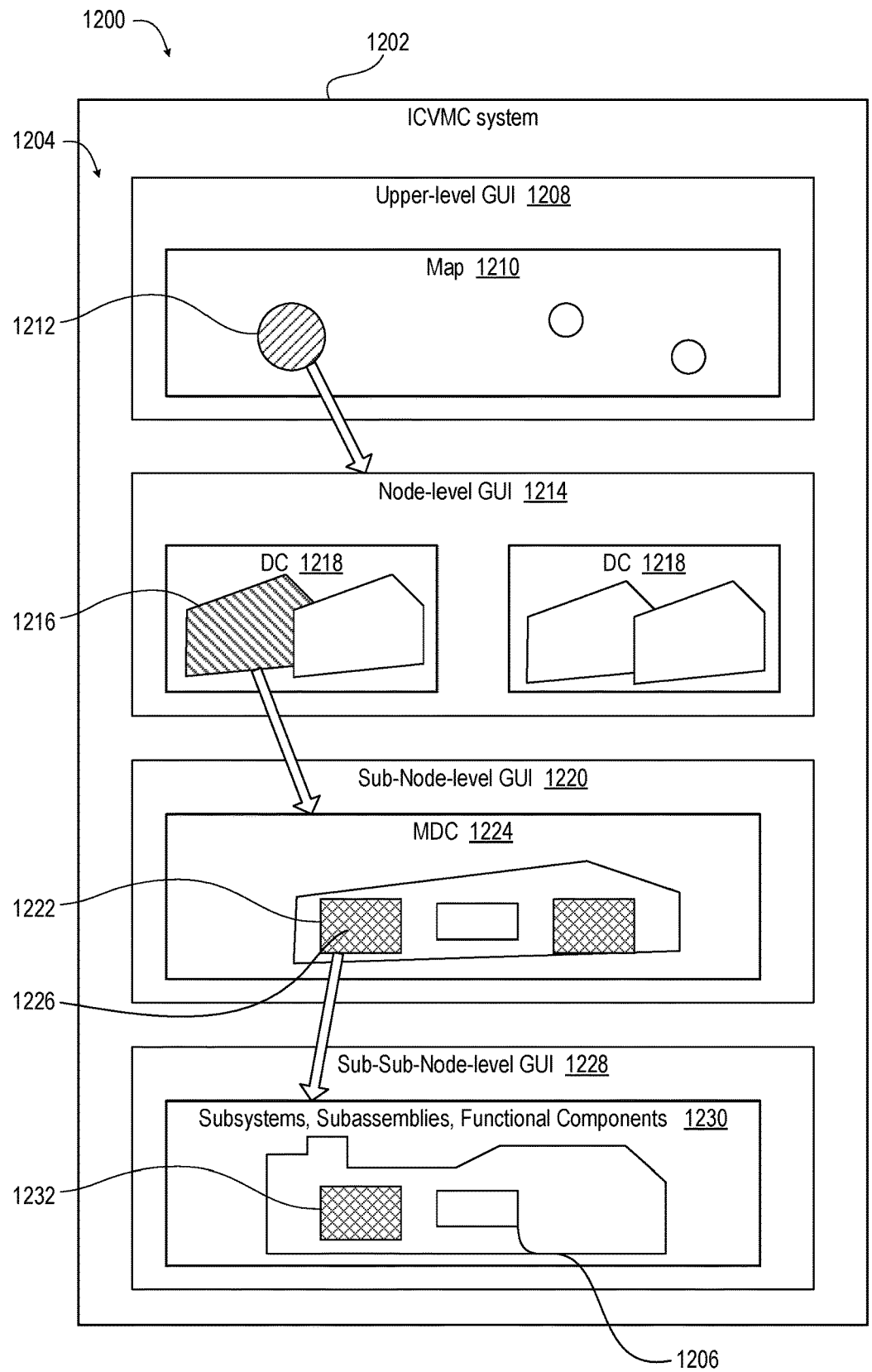
FIG. 12 illustrates a diagram of multi-tier GUIs depicting a failure indication, according to one or more embodiments.

FIG. 12 illustrates an LIHS 1200 having an ICVMC system 1202 that depicts multi-tier GUIs 1204 that enable a user to investigate degraded operating states and failures of functional components 1206. An upper level GUI 1208 can depict geographically displaced portions of the LIHS 1200 on a map 1210. One location indication 1212 can have color, pattern or size, etc. that alerts a user of a status that warrants further investigation. For example, a portion of the LIHS 1200 can indicate requiring maintenance although a severity can be relatively low due to sufficient redundancy at the location to handle the work load. Selecting the location indication 1212 within the upper level GUI 1208 can direct a user to a node-level GUI 1214 with a status indication 1216 for a particular data center 1218 that is operating at a degraded level due to a failure condition. The user can selected the particular data center 1218 to further investigate the failure condition, which selection links to a sub-node GUI 1220 that depicts a particular MDC 1224. Portions 1222 of the MDC 1224 can be annotated with a failure indication 1226. Further investigation can be facilitated by selecting a failed portion 1222 to interact with a lower Sub-Sub-Node level GUI 1228 such as depicting subsystems, subassemblies, functional components, 1230, etc., that have failure indication 1232. The severity of the indication at each level of the multi-tier GUIs 1204 can change with greater granularity of a portion of the LIHS 1200. At a top level, a particular failure may have no discernible impact to performance of the entire LIHS 1200. At the lowest levels of the multi-tier GUIs 1204 a failure can have the highest severity with regard to the operability of an affected subsystem or system.

Figure 13A:
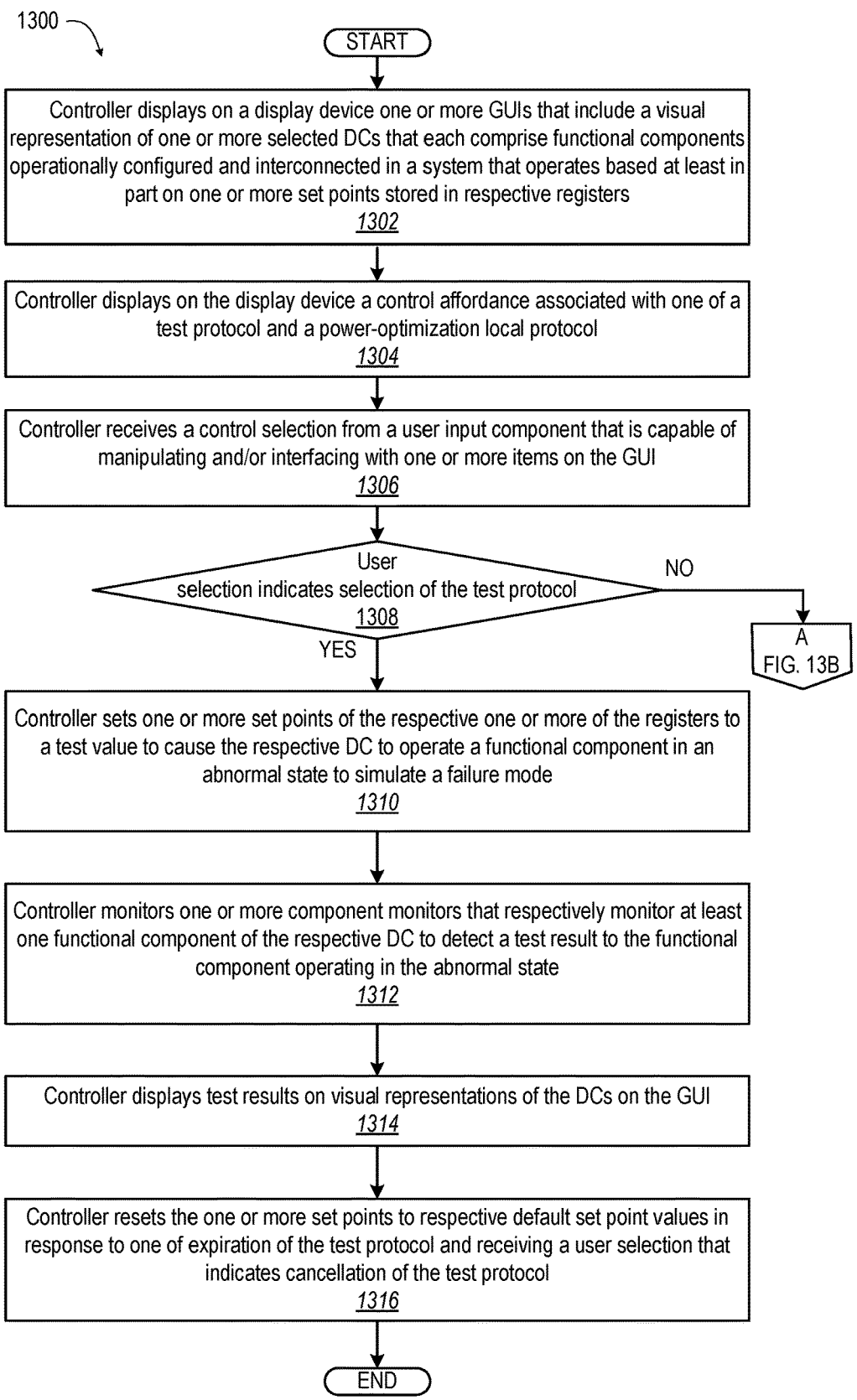
FIGS. 13A-13B illustrate a method of interactive component-level visual monitoring and controlling an IHS, according to one or more embodiments.
Figure 13B:
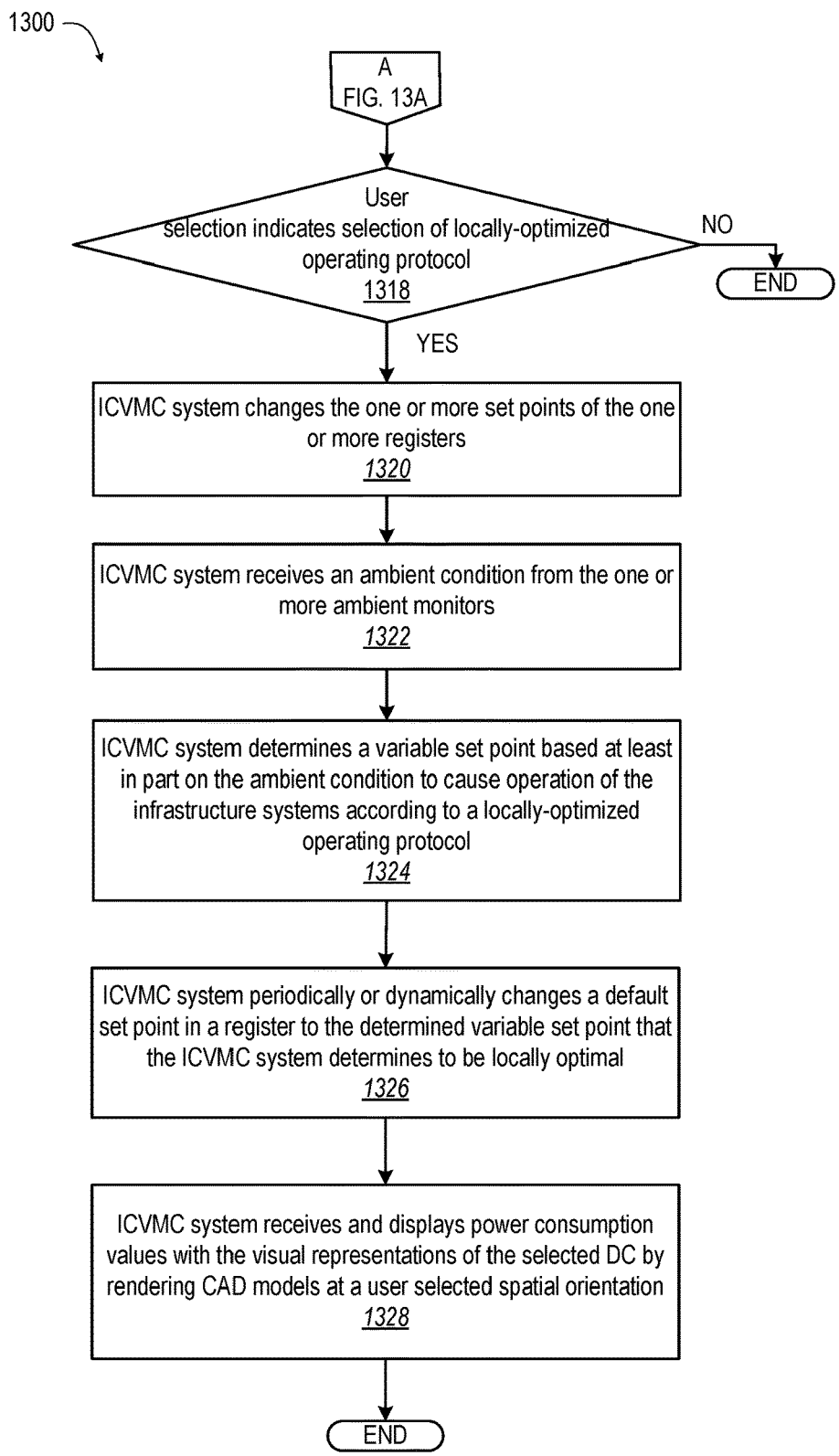

FIGS. 13A-13B illustrate a flowchart of an exemplary method 1200 by which processor 154 (FIG. 1) or processor 354 (FIG. 3) within the preceding figures performs different aspects of the processes that enable the one or more embodiments of the disclosure. Generally, method 1200 represents a computer-implemented method. The description of method 1200 is provided with general reference to the specific components illustrated within the preceding FIGS. 1-12. Generally method 1200 is described as being implemented via processor 154 (FIG. 1) or processor 354 (FIG. 3) and particularly the execution of code provided by variable set point program module 309 (FIG. 3) within processor 154 (FIG. 1) or processor 354 (FIG. 3). The execution of this variable set point program module 309 results in the implementation of locally-optimized operation of functional components 145 in the IHS 100 (FIG. 1). It is however appreciated that certain aspects of the described methods may be implemented via other processing devices and/or execution of other code.

FIGS. 13A-13B illustrate a method 1300 of variable set point testing and local optimization of a LIHS. Each DC has functional components operationally configured and interconnected in a system that operates based at least in part on one or more set points stored in respective registers. In one or more embodiments, the method 1300 includes an ICVMC system displaying on a display device one or more GUIs that include a visual representation of one or more selected DCs (block 1302). The method 1300 includes the ICVMC system displaying on the display device a control affordance associated with one of a test protocol and a power-optimization local protocol (block 1304). The method 1300 includes the ICVMC system receiving a control selection from a user input component that is capable of manipulating and/or interfacing with one or more items on the GUI (block 1306). The method 1300 includes the ICVMC system making a determination of whether the user selection indicates selection of the test protocol (decision block 1308). In response to determining in decision block 1308 that the user selection indicates selection of the test protocol, the method 1300 includes the ICVMC system setting one or more set points of the respective one or more of the registers to a test value to cause the respective DC to operate a functional component in an abnormal state (block 1310). The method 1300 includes the ICVMC system monitoring one or more component monitors that respectively monitor at least one functional component of the respective DC to detect a test result of the functional component operating in the abnormal state (block 1312). The method 1300 includes the ICVMC system displaying test results on visual representations of the DCs on the GUI (block 1314). The method 1300 includes the ICVMC system resetting the one or more set points to respective default set point values in response to one of expiration of the test protocol and receiving a user selection that indicates cancellation of the test protocol (block 1316). Then method 1300 ends.

In response to determining in decision block 1308 that the user selection does not indicate selection of the test protocol, the method 1300 includes a further determination of whether the user selection indicates a locally-optimized operating protocol (decision block 1318). In response to determining in decision block 1318 that the user selection does not indicate the locally-optimized operating protocol, then method 1300 ends. In response to determining in decision block 1318 that the user selection does indicate the locally-optimized operating protocol of an infrastructure power or cooling system of the respective DC, then method 1300 includes the ICVMC system changing the one or more set points of the one or more registers (block 1320). The method 1300 includes the ICVMC system receiving an ambient condition from the one or more ambient monitors (block 1322). The method 1300 includes the ICVMC system determining a variable set point based at least in part on the ambient condition to cause operation of the infrastructure systems according to a locally-optimized operating protocol. In one embodiment, the method 1300 includes ICVMC system periodically or dynamically changing a default set point in a register to the determined variable set point that the ICVMC system determines to be locally optimal (block 1324). The method 1300 includes ICVMC system setting the registers of respective DCs to the determined variable set points (block 1326). The method 1300 includes the ICVMC system receiving and displaying power consumption values with the visual representations of the selected DC by rendering CAD models at a user selected spatial orientation (block 1328).

For example, in certain localities, power rates can cost different amounts for different times of the day. A protocol can determine that cost savings are realized by cooling the system to a lower end of a temperature range during an inexpensive rate period and letting the temperature rise to an upper end of the temperature range during an expensive rate period. For another example, the locally-optimized operating protocol can dictate that a total power consumption level cannot be exceeded. The variable set point can balance power given to cooling and power given to computing components that generate the requirement for cooling based on the ambient conditions in order not to exceed this local total power limit. In one or more embodiments, the method 1300 can include the ICVMC system changing a register to indicate that a set point is variable, enabling the selected DC to dynamically vary the set point according to local ambient conditions for a locally-optimized operational result.

In the above described flow chart of FIGS. 13A-13B, one or more of the methods may be embodied in an automated controller that performs a series of functional processes. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A large-scale information handling system (LIHS) comprising:
    more than one data center (DC) that each comprise functional components operationally configured and interconnected in a system that operates based at least in part on one or more set points stored in respective one or more registers, wherein each of the more than one DC comprises:
        an infrastructure power or cooling system of the respective DC and one or more ambient monitors; and
        a local controller in communication with the one or more ambient monitors, the infrastructure power or cooling system, and the one or more registers and which:
            detects the one or more registers are set to enable variable set points;
            receives an ambient condition from the one or more ambient monitors; and
            in response to detecting the enabled variable set points, configures operation of infrastructure power or cooling systems based on the received ambient condition to reduce power consumption;
    an interactive component-level visual monitoring and control (ICVMC) system comprising:
        a network interface in communication with the one or more registers of the one or more DCs;
        a memory containing a configuration datastructure containing:
            a default set point for each of the set points in the respective registers of each DC; and
            a protocol for performing a variable set point procedure, the protocol comprises a locally-optimized operating protocol; and
        a controller that changes the one or more set points of the one or more registers each to a variable set point based on the locally-optimized operating protocol, the controller comprising: a processor in communication with the network interface and memory and that executes a program module to configure the ICVMC system to change the one or more set points of one or more registers in at least one DC, based upon the protocol.

2. The LIHS of claim 1, wherein:
    the protocol comprises a testing protocol;
    each of the one or more DCs further comprise one or more component monitors that respectively monitor at least one functional component and that communicate with a network controller; and
    the controller executes the testing protocol by:
        setting one or more set points of the respective one or more of the registers to a test value to cause the respective DC to operate a functional component in an abnormal state; and
        monitoring the one or more component monitors of the respective DC to detect a test result of the functional component operating in the abnormal state.

3. The LIHS of claim 2, further comprising:
    a display device that provides a graphical user interface (GUI) on which a control affordance can be presented;
    at least one user input component capable of manipulating and/or interfacing with one or more items on the GUI;
    wherein the controller responds to a user selection of a user indication by:
        setting the one or more set points to execute the test protocol;
        displaying test results on visual representations of the DCs on the GUI; and
        resetting the one or more set points to respective default set point values.

4. The LIHS of claim 1, wherein:
    each of the one or more DCs further comprise one or more ambient monitors;
    the protocol comprises a locally-optimized operating protocol; and
    the controller communicates via the network interface to:
        receive a respective ambient condition from the one or more ambient monitors of a selected DC; and
        dynamically setting the set points in the one or more registers of the selected DC based on the respective ambient conditions to reduce power consumption by the selected DC.

5. The LIHS of claim 4, further comprising:
    a display device that provides a graphical user interface (GUI) on which a control affordance can be presented;
    at least one user input component capable of manipulating and/or interfacing with one or more items on the GUI;
    wherein the controller responds to a user selection of the control affordance by:
        setting the one or more set points to execute the locally-optimized operating protocol for one or more selected DCs;
        receiving power consumption values for the one or more selected DCs; and
        displaying power consumption values on visual representations of the respective one or more selected DCs on the GUI.

6. The LIHS of claim 1, further comprising a display device;
    wherein the memory contains visual representations of the functional components, infrastructure systems, and the DCs; and
    wherein the ICVMC system displays on the display device one or more graphical user interfaces (GUIs) that include a visual representation and current setting of one or more registers associated with a one or more of selected DCs, functional components, and an infrastructure system.

7. An interactive component-level visual monitoring and control (ICVMC) system of a large-scale information handling system (LIHS), the ICVMC system comprising:
a network interface in communication with one or more registers of one or more data centers (DCs) that each comprise functional components operationally configured and interconnected in a system that operates based at least in part on one or more set points stored in respective registers, each DC of the one or more DCs comprising an infrastructure power or cooling system of the respective DC, and each of the one or more DCs further comprise:
one or more ambient monitors; and
a local controller in communication with the one or more ambient monitors, the infrastructure power or cooling system, and the one or more registers and which:
detects the one or more registers are set to enable variable set points;
receives an ambient condition from the one or more ambient monitors; and
in response to detecting the enabled variable set points, configures operation of infrastructure systems, based on the received ambient condition, to reduce power consumption;
a memory containing a configuration datastructure containing:
a respective address of each DC;
a default set point for each of the set points in the respective registers of each DC; and
a protocol for one of testing and locally optimized operation of the functional components by controlling the one or more set points stored in the respective registers, the protocol comprising a locally-optimized operating protocol; and
a processor in communication with the network interface and memory and that executes a program module to configure the ICVMC system to:
change the one or more set points respectively in one or more registers in at least one DC based upon the protocol to obtain one of a test result and a local optimization of the at least one DC, wherein the ICVMC system changes each of the one or more set points of the one or more registers to a variable set point based on the locally-optimized operating protocol.

8. The ICVMC system of claim 7, wherein:
the protocol comprises a testing protocol;
each of the one or more DCs further comprise one or more component monitors that respectively monitor at least one functional component and that communicate with a network controller; and
the ICVMC system executes the testing protocol by:
setting one or more set points of the respective one or more of the registers to a test value to cause the respective DC to operate a functional component in an abnormal state; and
monitoring the one or more component monitors of the respective DC to detect a test result of the functional component operating in the abnormal state.

9. The ICVMC system of claim 8, further comprising:
a display device that provides a graphical user interface (GUI) on which a control affordance can be presented;
at least one user input component capable of manipulating and/or interfacing with one or more items on the GUI;
wherein the ICVMC system responds to a user selection of the control affordance by:
setting the one or more set points to execute the test protocol;
displaying test results on visual representations of the DCs on the GUI; and
resetting the one or more set points to respective default set point values.

10. The ICVMC system of claim 7, wherein:
each of the one or more DCs further comprise one or more ambient monitors;
the protocol comprises a locally-optimized operating protocol; and
the ICVMC system communicates via the network interface to:
receive a respective ambient condition from the one or more ambient monitors of a selected DC; and
dynamically setting the set points in the one or more registers of the selected DC based on the respective ambient conditions to reduce power consumption by the selected DC.

11. The ICVMC system of claim 10, further comprising:
a display device that provides a graphical user interface (GUI) on which a control affordance can be presented;
at least one user input component capable of manipulating and/or interfacing with one or more items on the GUI;
wherein the ICVMC system responds to a user selection of the control affordance by:
setting the one or more set points to execute the locally-optimized operating protocol for one or more selected DCs;
receiving power consumption values for the one or more selected DCs; and
displaying power consumption values on visual representations of the respective one or more selected DCs on the GUI.

12. The ICVMC system of claim 7, further comprising a display device;
wherein the memory contains visual representations of the functional components, infrastructure power or cooling system of the selected DC, and the DCs; and
wherein the ICVMC system displays on the display device one or more graphical user interfaces (GUIs) that include a visual representation and current setting of one or more registers associated with a one or more of selected DCs, functional components of selected DCs, and the infrastructure power or cooling system of selected DCs.

13. A method of variable set point testing and local optimization of a large-scale information handling system (LIHS), the method comprising:
displaying on a display device one or more graphical user interfaces (GUIs) that include a visual representation of one or more selected data centers (DCs) that each comprise functional components operationally configured and interconnected in a system of the one or more distance that operates based at least in part on one or more set points stored in respective registers, each DC comprising an infrastructure power or cooling system of the respective DC;
receiving, via a local controller, an ambient condition from the one or more ambient monitors;
detecting the variable set point;
in response to detecting the variable set point, configuring operation of a power or cooling infrastructure system of a selected DC, based on the received ambient condition, to reduce power consumption;

displaying on the display device at least one control affordance associated with a protocol for setting variable set points, the protocol comprising a locally-optimized operating protocol;

receiving a selection of one of the at least one control affordance from a user input component that is capable of manipulating and/or interfacing with one or more items on the GUI; and in response to receiving the user selection, changing one or more set points respectively in one or more registers in at least one DC, based upon the protocol, wherein the changing the one or more set points of the one or more registers comprises: changing each to a variable set point based on the locally-optimized operating protocol in a selected DC.

14. The method of claim 13, wherein
the protocol comprises a testing protocol and the method further comprises:

setting one or more set points of the respective one or more of the registers to a test value to cause the respective DC to operate a functional component in an abnormal state; and monitoring one or more component monitors that respectively monitor at least one functional component of the respective DC to detect a test result of the functional component operating in the abnormal state.

15. The method of claim 14, further comprising:
displaying test results on visual representations of the DCs on the GUI; and resetting the one or more set points to respective default set point values in response to one of expiration of the test protocol and receiving a user selection that indicates cancellation of the test protocol.

16. The method of claim 13, wherein:
each of the one or more DCs further comprise one or more ambient monitors;

the protocol comprises a locally-optimized operating protocol; and changing the one or more set points respectively in the one or more registers in at least one DC comprises:
receiving a respective ambient condition from the one or more ambient monitors of a selected DC; and
dynamically setting the set points in the one or more registers of the selected DC based on the respective ambient conditions to reduce power consumption by the selected DC.

17. The method of claim 13, wherein:
the visual representations comprise three-dimensional computer aided design (CAD) models; and displaying the visual representations comprises rendering the CAD models at a user selected spatial orientation.

* * * * *